US012184039B2

(12) United States Patent
Zediker et al.

(10) Patent No.: US 12,184,039 B2
(45) Date of Patent: Dec. 31, 2024

(54) MULTI kW CLASS BLUE LASER SYSTEM

(71) Applicant: Nuburu, Inc., Centennial, CO (US)

(72) Inventors: Mark Zediker, Castle Rock, CO (US); Jean Philippe Feve, Monument, CO (US); Matthew Silva Sa, Parker, CO (US); Michael Jansen, Palo Alto, CA (US)

(73) Assignee: Nuburu, Inc., Centernnial (CO)

( * ) Notice: Subject to any disclaimer, the term of this patent is extended or adjusted under 35 U.S.C. 154(b) by 0 days.

(21) Appl. No.: 18/310,205

(22) Filed: May 1, 2023

(65) Prior Publication Data

US 2024/0136802 A1 Apr. 25, 2024
US 2024/0235166 A9 Jul. 11, 2024

Related U.S. Application Data

(60) Division of application No. 16/178,478, filed on Nov. 1, 2018, now Pat. No. 11,646,549, which is a
(Continued)

(51) Int. Cl.
*H01S 5/40* (2006.01)
*G02B 26/00* (2006.01)
(Continued)

(52) U.S. Cl.
CPC ............ *H01S 5/4012* (2013.01); *G02B 26/00* (2013.01); *H01S 3/094046* (2013.01);
(Continued)

(58) Field of Classification Search
CPC ............. H01S 5/4012; H01S 3/094046; H01S 3/094053; H01S 5/02251; H01S 5/02253;
(Continued)

(56) References Cited

U.S. PATENT DOCUMENTS

2002/0110328 A1* 8/2002 Bischel ................ G02B 6/4201
  385/27
2009/0245315 A1* 10/2009 Faybishenko ........ G02B 6/4214
  372/50.12
(Continued)

*Primary Examiner* — Yuanda Zhang
(74) *Attorney, Agent, or Firm* — Glen P. Belvis; Belvis Law, LLC.

(57) ABSTRACT

The invention may be embodied in other forms than those specifically disclosed herein without departing from itMulti-kW-class blue (400-495 nm) fiber-delivered lasers and module configurations. In embodiments, the lasers propagate laser beams having beam parameter products of <5 mm*mrad, which are used in materials processing, welding and pumping a Raman laser. In an embodiment the laser system is an integration of fiber-coupled modules, which are in turn made up of submodules. An embodiment has submodules having a plurality of lensed blue semiconductor gain chips with low reflectivity front facets. These are locked in wavelength with a wavelength spread of <1 nm by using volume Bragg gratings in an external cavity configuration. An embodiment has modules having of a plurality of submodules, which are combined through wavelength multiplexing with a bandwidth of <10 nm, followed by polarization beam combining. The output of each module is fiber-coupled into a low NA fiber. In an embodiment a kW-level blue laser system is realized by fiber bundling and combining multiple modules into a single output fiber.

27 Claims, 14 Drawing Sheets

Related U.S. Application Data continuation-in-part of application No. 14/837,782, filed on Aug. 27, 2015, now Pat. No. 10,562,132.

(60) Provisional application No. 62/580,419, filed on Nov. 1, 2017, provisional application No. 62/193,047, filed on Jul. 15, 2015, provisional application No. 62/042,785, filed on Aug. 27, 2014.

(51) Int. Cl.
| | | |
|---|---|---|
| *H01S 3/094* | (2006.01) | |
| *H01S 3/0941* | (2006.01) | |
| *H01S 5/02251* | (2021.01) | |
| *H01S 5/02253* | (2021.01) | |
| *H01S 5/023* | (2021.01) | |
| *H01S 5/02326* | (2021.01) | |
| *H01S 5/0233* | (2021.01) | |
| *H01S 5/024* | (2006.01) | |
| *H01S 5/028* | (2006.01) | |
| *H01S 5/30* | (2006.01) | |
| *H01S 5/00* | (2006.01) | |
| *H01S 5/0235* | (2021.01) | |
| *H01S 5/068* | (2006.01) | |
| *H01S 5/12* | (2021.01) | |
| *H01S 5/14* | (2006.01) | |
| *H01S 5/323* | (2006.01) | |

(52) U.S. Cl.
CPC .... *H01S 3/094053* (2013.01); *H01S 3/09415* (2013.01); *H01S 5/02251* (2021.01); *H01S 5/02253* (2021.01); *H01S 5/023* (2021.01); *H01S 5/02326* (2021.01); *H01S 5/0233* (2021.01); *H01S 5/02469* (2013.01); *H01S 5/028* (2013.01); *H01S 5/3013* (2013.01); *H01S 5/4062* (2013.01); *H01S 5/005* (2013.01); *H01S 5/0071* (2013.01); *H01S 5/0235* (2021.01); *H01S 5/02423* (2013.01); *H01S 5/06821* (2013.01); *H01S 5/12* (2013.01); *H01S 5/141* (2013.01); *H01S 5/143* (2013.01); *H01S 5/146* (2013.01); *H01S 5/32341* (2013.01); *H01S 5/4031* (2013.01); *H01S 5/4087* (2013.01)

(58) Field of Classification Search
CPC .... H01S 5/023; H01S 5/0233; H01S 5/02469; H01S 5/028; H01S 5/4062; H01S 5/12; H01S 5/146; H01S 5/32341; H01S 5/4031

See application file for complete search history.

(56) References Cited

U.S. PATENT DOCUMENTS

| | | | |
|---|---|---|---|
| 2013/0010265 A1* | 1/2013 | Curtis | G02B 6/02 353/31 |
| 2015/0349481 A1* | 12/2015 | Kliner | H01S 5/4012 359/341.3 |
| 2017/0271837 A1* | 9/2017 | Hemenway | H01S 3/1001 |

* cited by examiner

MULTI kW CLASS BLUE LASER SYSTEM

This application is a divisional of U.S. patent application Ser. No. 16/178,478 filed Nov. 1, 2018, which application: (i) claims under 35 U.S.C. § 119(e)(1) the benefit of the filing date of US provisional application Ser. No. 62/580,419, filed Nov. 1, 2017; and (ii) is a continuation-in-part of U.S. patent application Ser. No. 14/837,782, filed Aug. 27, 2015, which claims under 35 U.S.C. § 119(e)(1) the benefit of the filing date of U.S. provisional application Ser. No. 62/042,785, filed Aug. 27, 2014 and U.S. provisional application Ser. No. 62/193,047, filed Jul. 15, 2015, the entire disclosures of each of which are incorporated herein by reference.

BACKGROUND OF THE INVENTION

Field of the Invention

The present inventions relate to high power laser systems that provide lower wavelength, e.g., about 350 nm to about 700 nm, wavelength laser energy, and uses for these systems and laser beams, including materials processing and laser welding applications.

Infrared red (IR) based (e.g., having wavelengths greater than 700 nm, and in particular wavelengths greater than 1,000 nm) additive manufacturing systems suffer from, among other things, two short comings, which limit both the build volume and the build speed.

As used herein, unless expressly stated otherwise, "UV", "ultra violet", "UV spectrum", and "UV portion of the spectrum" and similar terms, should be given their broadest meaning, and would include light in the wavelengths of from about 10 nm to about 400 nm, and from 10 nm to 400 nm.

As used herein, unless expressly stated otherwise, the terms "high power", "multi-kilowatt" and "multi-kW" lasers and laser beams and similar such terms, mean and include laser beams, and systems that provide or propagate laser beams that have at least 1 kW of power (are not low power, e.g., not less than 1 kW), that are at least 2 kW, (e.g., not less than 2 kW), that are at least 3 kW, (e.g., not less than 3 kW), greater than 1 kW, greater than 2 kW, greater than 3 kW, from about 1 kW to about 3 kW, from about 1 kW t about 5 kW, from about 2 kW to about 10 kW and other powers within these ranges as well as greater powers.

As used herein, unless expressly stated otherwise, the terms "visible", "visible spectrum", and "visible portion of the spectrum" and similar terms, should be given their broadest meaning, and would include light in the wavelengths of from about 380 nm to about 750 nm, and 400 nm to 700 nm.

As used herein, unless expressly stated otherwise, the terms "blue laser beams", "blue lasers" and "blue" should be given their broadest meaning, and in general refer to systems that provide laser beams, laser beams, laser sources, e.g., lasers and diodes lasers, that provide, e.g., propagate, a laser beam, or light having a wavelength from about 400 nm to about 495 nm.

As used herein, unless expressly stated otherwise, the terms "green laser beams", "green lasers" and "green" should be given their broadest meaning, and in general refer to systems that provide laser beams, laser beams, laser sources, e.g., lasers and diodes lasers, that provide, e.g., propagate, a laser beam, or light having a wavelength from about 495 nm to about 570 nm.

Generally, the term "about" as used herein, unless specified otherwise, is meant to encompass a variance or range of ±10%, the experimental or instrument error associated with obtaining the stated value, and preferably the larger of these.

As used herein, unless specified otherwise, the recitation of ranges of values, a range, from about "x" to about "y", and similar such terms and quantifications, includes each item, feature, value, amount or quantity falling within that range. As used herein, unless specified otherwise, each and all individual points within a range are incorporated into this specification, are a part of this specification, as if it were individually recited herein.

This Background of the Invention section is intended to introduce various aspects of the art, which may be associated with embodiments of the present inventions. Thus, the forgoing discussion in this section provides a framework for better understanding the present inventions, and is not to be viewed as an admission of prior art.

SUMMARY

The present inventions advance the art and solves the long standing need for providing and utilizing high power blue, blue-green and green lasers; and provides solutions to long standing problems with IR additive manufacturing systems and process, and address these and other long felt needs, as well as future needs as additive manufacturing process and systems achieve greater prevalence. The present inventions, among other things, advances the art and solves these problems and needs by providing the articles of manufacture, devices and processes taught, and disclosed herein.

Thus, there is provided a blue laser diode system (400 nm-495 nm) that launches >100 Watts into a 50 to 200 μm fiber.

Further, there is provided a high power blue laser diode system (400 nm-495 nm) that launches >1000 Watts into a 150 μm fiber.

Additionally, there is provided a high-power blue laser diode system with about 5 mm-mrad beam parameter product to pump a Raman fiber laser or process materials; where such material processing, includes for example, welding, cutting, cladding, and 3-d printing.

Further, there is provided a high-power blue laser diode system with about 10 mm-mrad beam parameter product to pump a Raman fiber laser and process materials.

Yet further, there is provided a high-power blue diode laser system that is spectrally beam combined to produce a narrow enough (<10 nm) composite beam that can be used to pump a high power Raman laser system and process materials.

Additionally, there is provided a high-power blue diode laser system that is spectrally beam combined to produce a narrow enough (<10 nm) composite beam that can be used to pump a high-power Raman laser system or process materials, wherein the high-power blue diode laser system uses a prism to spectrally beam combine.

Yet further, there is provided a high-power blue diode laser system that is spectrally beam combined to produce a narrow enough (<10 nm) composite beam that can be used to pump a high-power Raman laser system or process materials, wherein the high-power blue diode laser uses a diffractive element to spectrally beam combine.

Yet further, there is provided a high-power blue diode laser system that is spectrally beam combined to produce a narrow enough (<10 nm) composite beam that can be used to pump a high-power Raman laser system or process materials, wherein the high power blue diode laser uses a volume Bragg grating to spectrally beam combine.

Yet further, there is provided a high-power blue diode laser system that is spectrally beam combined to produce a narrow enough (<10 nm) composite beam that can be used to pump a high-power Raman laser system or process materials, wherein the high-power blue diode laser uses dielectric coatings as filters to spectrally beam combine.

Additionally, there is provided a 100-1,000 W power, blue laser diode system with about 5 mm-mrad beam parameter product to pump a Raman fiber laser or process materials.

Further, there is provided a 100-1,000 W power, blue laser diode system with 10 mm-mrad beam parameter product to pump a Raman fiber laser or process materials.

Yet further, there is provided a 100-1,000 W power, blue diode laser system that is spectrally beam combined to produce a narrow enough (<10 nm) composite beam that can be used to pump a high power Raman laser system or process materials.

Additionally, there is provided a 100-1,000 W power, blue diode laser system that is spectrally beam combined to produce a narrow enough (<10 nm) composite beam that can be used to pump a high-power Raman laser system or process materials, wherein the high-power blue diode laser system uses a prism to spectrally beam combine.

Yet further, there is provided a 100-1,000 W power, blue diode laser system that is spectrally beam combined to produce a narrow enough (<10 nm) composite beam that can be used to pump a high-power Raman laser system or process materials, wherein the high power blue diode laser uses a diffractive element to spectrally beam combine.

Yet further, there is provided 100-1,000 W power, a blue diode laser system that is spectrally beam combined to produce a narrow enough (<10 nm) composite beam that can be used to pump a high-power Raman laser system or process materials, wherein the high power blue diode laser uses a volume Bragg grating to spectrally beam combine.

Yet further, there is provided 100-1,000 W power, a blue diode laser system that is spectrally beam combined to produce a narrow enough (<10 nm) composite beam that can be used to pump a high-power Raman laser system or process materials, wherein the high-power blue diode laser uses a set of dichroic filters based on dielectric coatings to spectrally beam combine.

Thus, there is provided a laser system for providing a 100-1,000 W power, and more preferably a multi-kW laser beam having final output laser beam having a wavelength in the spectral range of about 400 nm to about 495 nm, the system includes 1, 2, 5, 10s and 100s of fiber-coupled modules, where each module is has 1, 2, 5, 10s and 100s of submodules. The submodules have 1, 2, 5, 10s and 100s of lensed blue semiconductor gain chips from the GaN material system, with the output facet reflectivity optimized for stable locking of the laser diodes; and are mounted on thermally conductive sub-mounts, with the lower reflectivity facet facing outward and with a fast axis-collimating lens attached in front of the gain chip. The lensed blue semiconductor gain chips are mounted on a staircase heatsink in an external cavity to optimally align the fast axis beamlets. These gain chips are configured such that each gain chip has its slow axis collimated by a slow axis collimating lens. A volume Bragg grating can be placed in front of the slow axis collimator to provide direct feedback to the laser to lock it to a predetermined wavelength. Alternatively, the volume Bragg grating may be integral to the fast axis collimator or the slow axis collimator. In addition, the volume Bragg grating can be placed after a turning mirror to create an external cavity. The polarization of each gain devices is maintained in the external cavity.

Thus, there is provided a laser system for providing a 100-1,000 W power, and more preferably a multi-kW laser beam having final output laser beam having a wavelength in the spectral range of about 400 nm to about 495 nm, the system includes 1, 2, 5, 10s and 100s of fiber-coupled modules, where each module is has 1, 2, 5, 10s and 100s of submodules. The submodules have 1, 2, 5, 10s and 100s of lensed blue semiconductor gain chips from the GaN material system, with the output facet reflectivity optimized for stable locking of the laser diodes; and are mounted on thermally conductive sub-mounts, with the lower reflectivity facet facing outward and with a fast axis-collimating lens attached in front of the gain chip. The lensed blue semiconductor gain chips are mounted on a staircase heatsink in an external cavity to optimally align the fast axis beamlets. These gain chips are configured such that each gain chip has its slow axis collimated by a slow axis collimating lens. The output of the individual gain chips can be coupled into an optical fiber with a fiber Bragg grating to lock the elements to a specific wavelength. The outputs the fibers are now at different wavelengths for each submodule which can then be combined spectrally by a dichroic filter, volume Bragg grating, transmission grating, or prism.

Thus, there is provided a laser system for providing a 100-1,000 W power, and more preferably a multi-kW laser beam having final output laser beam having a wavelength in the spectral range of about 400 nm to about 490 nm, the system includes 1, 2, 5, 10s and 100s of fiber-coupled modules, where each module is has 1, 2, 5, 10s and 100s of submodules. The submodules have 1, 2, 5, 10s and 100s of lensed blue semiconductor gain chips from the GaN material system, with an integral Bragg gratings to set the wavelength of the individual devices to a predetermined value. The chips are mounted on thermally conductive sub-mounts, with the output facet reflectivity optimized for the output power of the device facing outward and with a fast axis-collimating lens attached in front of the gain chip. The lensed blue semiconductor gain chips are mounted on a staircase heatsink in an external cavity to optimally align the fast axis beamlets. These gain chips are configured such that each gain chip has its slow axis collimated by a slow axis collimating lens. The outputs of the chips that are now at different wavelengths for each submodule which can then be combined spectrally by a dichroic filter, volume Bragg grating, transmission grating, or prism.

DESCRIPTION OF THE PREFERRED EMBODIMENTS

In general, the present inventions relate to high-power lower wavelength laser systems, beam combining to achieve these higher power laser beams and applications and uses for these beams. In particular, embodiments of the present inventions relate to a multi-kW-class blue fiber-coupled laser systems used for materials processing and laser welding applications, and in particular wavelengths in the wavelength range of about 400 nm to about 495 nm. Embodiments of these lasers have a plurality of blue semiconductor gain chips, which are power combined via staircase beam combining in an external cavity, wavelength multiplexing, polarization beam combining and fiber beam combining.

Further, and in particular, an embodiment of the present inventions addresses the architecture for a multi-kW-level blue laser system operating in the 400 to 495 nm spectral range, and about the 400 nm to about the 495 nm spectral range. The laser can achieve beam parameter products (BPP)<6 mm-mrad (mm*mrad, or mm mrad, i.e., mm times mrad). These types of lasers are highly desirable for processing or welding of materials with high optical absorption in the blue region of the spectrum, Cu being an example. These types of lasers are also highly desirable for pumping a Raman laser, or pumping a rare earth doped fiber laser, among other things.

Embodiments of the present laser system are multi-kW laser systems with emission in the blue wavelength of the spectrum (about 400 to about 495 nm) and more preferably in the 400 nm to 475 nm range, are very effective in materials processing applications, where the short emission wavelength is preferentially absorbed for virtually all metals, especially Cu and Au, which are difficult to process using IR laser sources. In many embodiments of applications, these systems use low numerical aperture (NA) fiber-optic delivery systems for ease of delivery and high brightness. In a preferred embodiment of the present inventions, the laser systems achieve a multi-kW laser beam, having a beam-parameter-products of about 5 mm*mrad which enables efficient fiber coupling.

Figure 1:
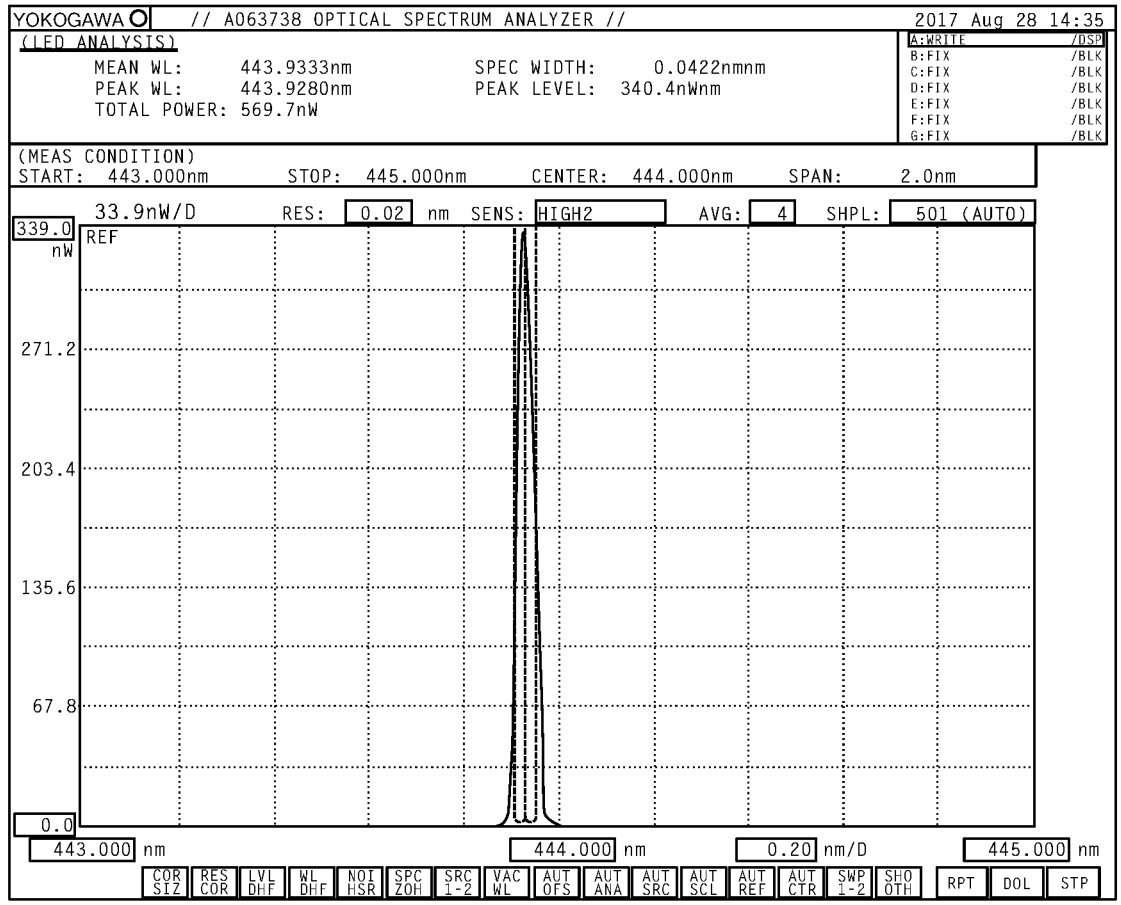
FIG. 1 is a spectrum generated by an optical spectrum analyzer, for a single blue gain element locked to a specific wavelength with a linewidth of 0.045 nm, in accordance with the present inventions.
Figure 1A:
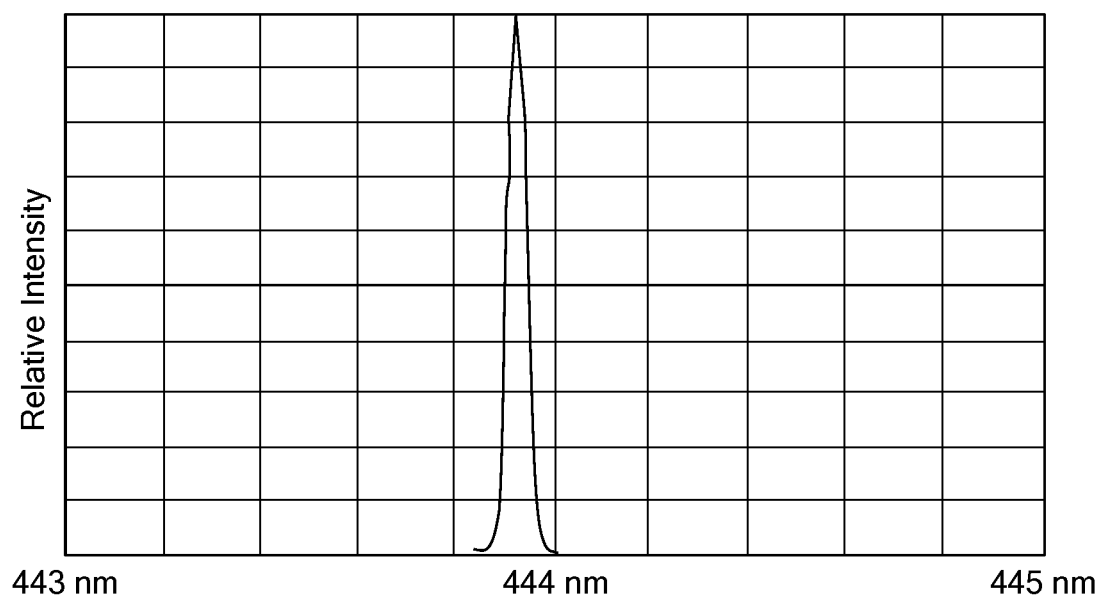
FIG. 1A is chart showing the spectrum for the single blue gain element locked to a specific wavelength with a linewidth of 0.045 nm of FIG. 1.

One of the advancements in the art by the present inventions, and upon which embodiments of the present inventions are based and utilized, is the ability to lock the wavelength of a blue laser diode gain chip to a specific wavelength with a linewidth of only 0.045 nm. A spectrum for an embodiment of such a locked wavelength laser beam this is shown in FIGS. 1 and 1A. It being understood, that any locked wavelength, with a linewidth of about 0.050 nm or less, a linewidth of about 0.045 nm or less, a linewidth of about 0.040 nm or less, a linewidth of from 0.050 nm to 0.350 nm, in the wavelength range of about 400 to 495 nm is contemplated. The ability to lock the blue laser diode gain chip enables a modular, dense wavelength beam combination design based on this wavelength locking result, for example in GaN.

The narrow linewidth is achieved, for example, by using a volume Bragg grating as the external feedback filter combined with an optimized coating reflectivity on the front facet. The optimized coating, helps to achieve a narrow locked linewidth because it, among other things, suppresses any parasitic oscillations due to subcavities. The subcavities that get suppressed include the laser diode element itself or a subcavity between the laser diode and any external optical elements, such as the collimating optics or the VBG itself.

An embodiment of the present inventions is a scalable laser system which includes individual submodules that are locked to a specific wavelength. These submodules are then combined using a dense wavelength beam combination technique followed by a polarization beam combination with a second leg of submodules. The resulting beam is then fiber coupled with a lens to be used directly, further combined with other modules to achieve even high output power, or coupled into a Raman gain fiber.

Embodiment of the submodules consist of a plurality of lensed blue semiconductor gain chips with lower reflectivity front facets. Semiconductor gain chips are made in the GaN material system and are widely used in the fabrication of blue and green LEDs and blue laser diodes. The gain chips are mounted on thermally conductive sub-mounts, with the lower reflectivity facet facing outward. A fast axis-collimating (FAC) lens is attached in front of the gain chip in order to collimate the emitted light in the fast axis. A Lensed Chip On Sub-mount is abbreviated as LCOS.

In an embodiment, the LCOS elements are mounted in a staircase configuration in an external cavity. There are typically two or greater LCOS elements in a submodule depending on the beam parameter product desired. The slow axis of the LCOS elements are collimated by individual slow axis collimating lenses, or SACs. The LCOS elements may be on electrically conducting or electrically isolating substrates and can be connected electrically in series, or series/parallel combinations. Wire bonding is typically used to connect the LCOS elements to the submodule electrodes. Turning mirrors are used to stack the collimated light in the fast axis and to relay it to an outcoupling element, which for example is a Volume Bragg Grating (VBG). Turning mirrors can also advantageously be combined with the SAC in a single optical element. Wavelength locking in the external cavity configuration results in a spectral bandwidth of <1 nm, typically <0.1 nm for the submodule assembly.

In an embodiment, the LCOS elements are mounted in a staircase configuration in an external cavity. There are typically two or greater LCOS elements in a submodule depending on the beam parameter product desired. The slow axis of the LCOS elements are collimated by individual slow axis collimating lenses, or SACs. The LCOS elements may be on electrically conducting or electrically isolating substrates and can be connected electrically in series, or series/parallel combinations. Wire bonding is typically used to connect the LCOS elements to the submodule electrodes. In this embodiment, the VBG is integrated into the FAC to provide both collimation in the fast axis and locking of the GaN gain element. Wavelength locking in the external cavity configuration results in a spectral bandwidth of <1 nm, typically <0.1 nm for the submodule assembly.

In an embodiment, the LCOS elements are mounted in a staircase configuration in an external cavity. There are typically two or greater LCOS elements in a submodule depending on the beam parameter product desired. The slow axis of the LCOS elements are collimated by individual slow axis collimating lenses, or SACs. The LCOS elements may be on electrically conducting or electrically isolating substrates and can be connected electrically in series, or series/parallel combinations. Wire bonding is typically used to connect the LCOS elements to the submodule electrodes. In this embodiment, the VBG is integrated into the SAC to provide both collimation in the slow axis and locking of the GaN gain element. Wavelength locking in the external cavity configuration results in a spectral bandwidth of <1 nm, typically <0.1 nm for the submodule assembly.

In an embodiment, the LCOS elements are mounted in a staircase configuration in an external cavity. The LCOS elements are collimated by a pair of FAC and SAC lenses. The output of the collimated LCOS elements are directed on to reflective or transmissive diffractive grating. The Littrow reflection from each of the grating can be used to lock the LCOS elements as well as redirect the output of the LCOS/Grating external cavity to a dichroic filter that is used to combined the other locked elements in the module.

The individual submodules that are locked to a specific wavelength are next combined into a higher power module using bandpass, long pass, short pass dichroic filters, VBGs, or diffractive gratings and prisms. The submodules can be combined with these techniques to produce a module with a bandwidth of <10 nm. Further power scaling can be achieved, for example by using polarization beam combing methods to combine a pair of wavelength combined submodules. A typical module may use two sets of thirteen submodules or more inside a module. Each set of thirteen submodules has a wavelength spread of <10 nm typically. The two sets are combined via polarization beam combining, where either a broad-band waveplate is used to rotate the polarization of one group of submodules or a pair of image rotating mirrors are used as an achromatic polarization rotator to overlap two separate groups of submodules. The module is then fiber-coupled into a low NA fiber using a focusing lens. Modules are contained in a sealed enclosure and are mounted on a heatsink. The heatsink can be a conventional heat exchanger or can be of the macro-channel or micro-channel type. Examples of different types of heatsinks are provided in Design of Diode Laser Heat Sinks, Fraunhofer-Institut fur Lasertechnik ILT, (January 2007), http://ilt.fraunhofer.de/ilt/pdf/eng/products/Heatsinks.pdf, the entire disclosure of which is incorporated herein by reference.

In an embodiment, a multi-kW-level blue laser system is realized by fiber bundling and combining multiple modules into a single output fiber. Pluralities of modules are combined using a fiber coupler designated as a N to one fiber coupler, where N>1 is the number of input fibers that are arranged in a geometric pattern optimized for the desired output fiber. The fibers and fiber coupler components are selected for low absorption and a high resistance to solarization in the blue region of the spectrum and the fabrication of the fiber coupler is optimized for blue light transmission.

In addition to the optical train, embodiments of these multi-kW laser systems can include, among other things: a cooling manifold, electronics/power supply, safety interlocks, optical power monitoring detectors and temperature monitoring sensors.

A preferred diode for use in the present laser systems are blue GaN laser diodes, which generally have good output power, efficiency and reliability. These diodes are then used in embodiments of the present laser systems as gain elements (with the reflectivity of the output facet coatings optimized for alignment and locking). Embodiments add the emitted power of individual lasers by using them in a staircase external cavity configuration at the submodule level. The staircase configuration allows a denser packing of the laser diode beams when combining multiple laser diode sources where the fast axis lens is larger than the desired vertical pitch of the stacked laser source. Further, in embodiments, combining submodules at the fiber-coupled module level is accomplished by wavelength multiplexing of the submodules and by polarization beam combining.

In embodiments, several modules (seven being a typical number) are combined via fiber power combining. This embodiment has a unique beam combining sequence of blue gain chips, using staircase beam combining in external cavities, wavelength multiplexing and polarization and fiber power beam combining, with each step adding more power to the assembly, while maximizing emitted radiance (brightness) at the system level. The use of individual laser diodes enables the system to be designed with the highest possible brightness allowing the fiber power beam combining method to be used for incoherent power scaling while still being able to produce a laser source with sufficient brightness to be able to weld, cut or pump another laser.

Commercial GaN multimode laser diodes in the blue region of the spectrum can achieve several watts of power from a single emitter (see for example the Nichia NDB7K75 multi-mode single emitter part, which is rated at 3.5 W of power in the 440-455 nm wavelength range, the product description of which can be found at http://www.nichia.co.jp/en/product/laser.html). The power of a plurality of GaN blue multimode semiconductor laser diodes or equivalent gain elements are added constructively, while maximizing brightness, to realize kW-power levels.

In an embodiment, a starting or basic component for the present laser systems is a Lensed Chip On Sub-mount (LCOS) gain element. The LCOS, for example, is made up of a GaN-based semiconductor gain chip, where GaN is a material system widely used to make blue LEDs and laser diodes. In this embodiment, the blue laser diode gain element has a Lower Reflectivity (LR) coating on the front emitting facet (<10%) in order to facilitate wavelength locking in an external cavity configuration. The low reflectivity coating is typical in semiconductor laser external cavity designs, for example of the type described by U.S. Pat. Nos. 5,050,179, 6,208,679, 6,192,062, WO 2016/042019, the entire disclosure of which is incorporated herein by reference. The lower reflectivity coating is selected to be optimized to enable wideband locking but also to allow lasing of the chip during lens alignment and attach. Preferably, the gain chip is soldered onto a sub-mount, which can be made out of a number of materials, including for example, SiC, diamond, Cu, CuW, or Cu—AlN—Cu.

The blue gain chip is attached to the submount using solder, which may come from a number of solder materials such as Sn and Sn-based alloys such as Au—Sn, or In and In-based alloys or a Nanofoil® (trademarked name by Indium Corporation for a reactive multi-layer foil material that undergoes a self-sustaining exothermic reaction after a heat pulse). The fast axis of the gain element is collimated using a Fast Axis Collimator (FAC). While Chip On Sub-mount (COS) apparatus, have found application in IR diode systems (see, e.g., WO 2016/160547, and U.S. Pat. Nos. 9,450,377 and 6,044,096, the entire disclosure of which is incorporated herein by reference), it is believed that they have not had general, if any, accepted commercial application, for LCOS in the blue wavelength range. Configuration of the present FAC lens for blue is tailored to a unique wavelength range, gain chip design, which can include considerations for height as dictated by manufacturing constraints, and sub-mount size.

In general, staircase beam combining of laser diodes is taught and disclosed in US 2004/0114648, U.S. Pat. Nos. 7,738,178, 7,7339,32, 7,668,214, 7,773,655, 8,427,749, 8,432,945, 8,437,086, 9,373,932 and 9,318,876, the entire disclosures of each of which are incorporated herein by reference.

In embodiments of the present inventions, the staircase beam combining of the laser diodes is for blue GaN emitting laser diodes or blue GaN gain chips (Lower Reflection (LR) coated chips), and preferably for configurations where the gain chips are located in an external cavity.

Embodiments of the inventions use blue LR-coated gain chips in an external cavity configuration, using a volume Bragg grating (VBG) as the outcoupling element. In an embodiment the beam combining approach includes, by way of example, staircase beam combining in an external cavity, patterned mirror combining in an external cavity, wavelength beam combining by multiplexing within a 10 nm bandwidth, polarization beam combining, fiber combining, and combinations and variations of these to realize an integrated system, that preferably provides a multi-kW, blue wavelength, having a beam parameter product of less than 5 mm-mrad.

VBGs that can be used in embodiments of the present inventions, for example, are described in U.S. Pat. Nos. 7,394,842 and 7,031,573, the entire disclosure of which is incorporated herein by reference. Fiber couplers/splitters that can be used in embodiments of the present inventions, for example, are disclosed in U.S. Pat. Nos. 7,218,828 and 7,532,792, the entire disclosure of each of which is incorporated herein by reference.

Embodiments of the present inventions can be cooled passively, (e.g., no flowing or forced moving cooling medium, e.g., a heat sink, ambient air, or both) or cooled actively. Examples of active cooling would include flowing gas, e.g., air, flowing a liquid cooling fluid, e.g., water by and in thermal contact with the diodes. A water-cooling system for laser diodes is disclosed in U.S. Pat. No. 9,413,136, the entire disclosure of which is incorporated herein by reference.

In an embodiment an optical apparatus is configured to produce a multi-kW of laser radiation with emission in the blue wavelength of the spectrum (400-495 nm), the optical apparatus including:
 a) M fiber-coupled modules, where each module is made up of N submodules, where M>1 and N>1; i. wherein submodules consist of P lensed blue semiconductor gain chips from the GaN material system, with coatings on the front facets with the lower reflectivity optimized for locking; and ii. are mounted on thermally conductive sub-mounts, with the lower reflectivity facet facing outward and with a fast axis-collimating lens attached in front of the gain chip; and, iii. the lensed blue semiconductor gain chips are mounted on a staircase heatsink in an external cavity to optimally lock the wavelength of the gain element to a predetermined wavelength; and, iv. the polarization of each gain devices is maintained in the external cavity design;
 b) wherein a fiber-coupled module includes a plurality of submodules; i. two sets of submodules or more are combined through wavelength multiplexing with a bandwidth of <10 nm; and ii. whereas the two sets of wavelength multiplexed submodules are combined via polarization beam combining; and, iii. wherein aforesaid modules are contained in sealed enclosures and are mounted on heatsinks; and,
 c) the fibers of the plurality of modules are bundled and combined into a single output fiber, producing a KW-level blue laser system.

Embodiments of these laser systems, modules, submodules and methods can have one or more of the following features: wherein the output of the gain element of the optical apparatus is collimated and redirected with a turning mirror to the next beam combining element; wherein the output of the gain element of the optical apparatus is collimated and is aligned with the next beam combining element; including a GaN gain element with the lower facet reflectivity facing outward, and a volume Bragg Grating integrated with the Fast Axis Collimating lens; including a GaN gain element with the lower facet reflectivity facing outward, and a volume Bragg Grating after the Fast Axis Collimating lens; including a GaN gain element with the lower facet reflectivity facing outward, and a volume Bragg Grating after the Slow Axis collimating lens; including a GaN gain element with the lower facet reflectivity facing outward, and a reflective diffractive grating operating in a Littrow configuration, after the Slow Axis Collimating lens and redirecting the output to the Dichroic filters; including a GaN gain element with the lower facet reflectivity facing outward, and a transmissive diffractive grating operating in conjunction with a mirror to provide the feedback to the gain element and to redirect the output to the Dichroic filters; including a GaN gain element with the lower facet reflectivity facing outward, and a collimating optical system, with the output coupled into an optical fiber with the optical fiber having a fiber Bragg grating imbedded in the fiber to determine the feedback and wavelength of the GaN gain elements; characterized in that, the apparatus is configured to provide a laser beam having a beam parameter product of <3.5 mm*mrad on the fast axis; characterized in that, the apparatus is configured to provide a laser beam having a beam parameter product <5 mm*mrad on the slow axis; characterized in that, the apparatus is configured to provide a laser beam having a beam parameter product of >3.5 mm-mrad but <5 mm-mrad overall; characterized in that, the apparatus is configured to provide a laser beam having a beam parameter product of >5 mm-mrad, but <10 mm-mrad overall; characterized in that, the apparatus is configured to provide a spectral emission of <10 nm in the 400-495 nm region of the spectrum; characterized in that, the apparatus is configured to provide a spectral emission of >1 nm but <5 nm, >1 nm, but <10 nm, >1 nm, but <15 nm, and >1 nm but <20 nm; characterized in that, the gain chip front facet reflectivity is <10%; characterized in that, the gain chip front facet reflectivity is selected from the group including >10% but <15%, >15% but <20%, and >20% but <30%; characterized in that, there are P lensed blue semiconductor gain chips on sub-mounts in each submodule, where P is >1; characterized in that, the lensed blue GaN—based semiconductor gain chips are connected electrically in series, or series/parallel electrical combinations and wire-bonded to the submodule electrodes; characterized in that, the fibers have to be selected for low absorption in the blue region of the spectrum and the fabrication of the fiber coupler has to be optimized for blue light transmission; characterized in that, each submodule has <1 nm spectral distribution following wavelength locking in the external cavity configuration; characterized in that, there are two sets of twelve submodules inside a module; characterized in that, M modules (M>1) are combined using a fiber coupler with K input fibers (K>M), in an arbitrary geometric packaging arrangement optimized for the selected output fiber or output beam; characterized in that, the kW laser system includes: a cooling manifold; characterized in that, the kW laser system includes: electronics/power supply; characterized in that, the kW laser system includes: safety interlocks; characterized in that, the kW laser system includes: optical power-monitoring detectors; and characterized in that, the kW laser system includes: temperature-monitoring sensors.

In an embodiment an optical apparatus is configured to produce multi-kW of laser radiation with emission in the blue wavelength of the spectrum (400-495 nm), the optical apparatus including:
  a) M fiber-coupled modules, where each module is made up of N submodules, where M>1 and N>1; i. wherein submodules consist of P lensed blue semiconductor gain chips from the GaN material system, with coatings on the front facets with the lower reflectivity optimized for locking; and ii. are mounted on thermally conductive sub-mounts, with the lower reflectivity facet facing outward and with a fast axis-collimating lens attached in front of the gain chip; and iii. the lensed blue semiconductor gain chips are mounted on a staircase heatsink in an external cavity to optimally align the fast axis beamlets; iv. wherein each gain chip has its slow axis collimated by a slow axis collimating lens and has the radiation being redirected by turning mirrors to the output coupler; and, v. wherein each LCOS is now aligned through the dichroic filters and an output coupler provides feedback to each of the gain elements and the dichroic filter elements now determine the operating wavelength of each of the LCOS assemblies;
  b) wherein a fiber-coupled module includes of a plurality of submodules; i. two sets of submodules are combined through wavelength multiplexing with a bandwidth of <10 nm; and ii. whereas the two sets of wavelength multiplexed submodules are combined via polarization beam combining; and iii. wherein aforesaid modules are contained in sealed enclosures and are mounted on actively cooled heatsinks; and
  c) the fibers of the plurality of modules are bundled and combined into a single output fiber, producing a KW-level blue laser system.

Embodiments of these laser systems, modules, submodules and methods can have one or more of the following features: characterized in that, it has a beam parameter product of <3.5 mm*mrad on the fast axis; characterized in that, it has a beam parameter product <5 mm*mrad on the slow axis; with a beam parameter product of >3.5 mm-mrad but <5 mm-mrad overall; with a beam parameter product of >5 mm-mrad, but <10 mm-mrad overall; characterized in that, it has a spectral emission of <10 nm in the 400-495 nm region of the spectrum; that has a spectral emission of >1 nm but <5 nm, >1 nm, but <10 nm, >1 nm, but <15 nm, and >1 nm but <20 nm; characterized in that, the gain chip front facet reflectivity is <10%; characterized in that, the gain chip front facet reflectivity is >10% but <15%, >15% but <20% and >20% but <30%; characterized in that, there are P lensed blue semiconductor gain chips on sub-mounts in each submodule, where P is >1; characterized in that, the lensed blue GaN—based semiconductor gain chips are connected electrically in series, or series/parallel electrical combinations and wire-bonded to the submodule electrodes; characterized in that, the fibers have to be selected for low absorption in the blue region of the spectrum and the fabrication of the fiber coupler has to be optimized for blue light transmission; characterized in that, each submodule has <1 nm spectral distribution following wavelength locking in the external cavity configuration; characterized in that, there are two sets of twelve submodules inside a module; characterized in that, M modules (M>1) are combined using a fiber coupler with K input fibers (K>M), in an arbitrary geometric packaging arrangement optimized for the selected output fiber or output beam; characterized in that, the kW laser system includes: a cooling manifold; characterized in that, the kW laser system includes: electronics/power supply; characterized in that, the kW laser system includes: safety interlocks; characterized in that, the kW laser system includes: optical power-monitoring detectors; and, characterized in that, the kW laser system includes: temperature-monitoring sensors.

In an embodiment an optical apparatus is configured to produce a multi-kW of laser radiation with emission in the blue wavelength of the spectrum (400-495 nm), the optical apparatus including:
  a) M fiber-coupled modules, where each module is made up of N submodules, where M>1 and N>1; i. wherein submodules consist of P lensed blue semiconductor laser chips from the GaN material system, with a Distributed Bragg or Feedback Grating integrated into the GaN chip to select its operating wavelength; and ii. are mounted on thermally conductive sub-mounts, with the lower reflectivity facet facing outward and with a fast axis-collimating lens attached in front of the laser; and iii. are mounted on a thermally conductive heatsink, with a slow axis collimating lens after the fast axis-collimating lens, iv. the lensed blue semiconductor lasers are mounted on a staircase heatsink; v. and the polarization of each laser devices is established by the waveguide configuration of the laser device;
  b) wherein a fiber-coupled module includes a plurality of submodules; i. two sets of submodules or more are combined through wavelength multiplexing with a bandwidth of <10 nm; and ii. whereas the two sets of wavelength multiplexed submodules are combined via polarization beam combining; and iii. wherein aforesaid modules are contained in sealed enclosures and are mounted on heatsinks; and
  c) the fibers of the plurality of modules are bundled and combined into a single output fiber, producing a KW-level blue laser system.

Embodiments of these laser systems, modules, submodules and methods can have one or more of the following features: wherein the output of the gain element of the optical apparatus is now collimated and is redirected with a turning mirror to the next beam combining element; wherein the output of the gain element of the optical apparatus is now collimated and is aligned with the next beam combining element; including a reactive multi-layer foil, wherein the foil undergoes a self-sustaining exothermic reaction after a heat pulse; to bond the individual LCOS assemblies into the submodules and the submodules into the modules; wherein the foil is NANOFOIL (provided by Indium Corporation); configured to provide a sufficiently narrow linewidth to pump a fiber based Raman laser (<10 nm for fused silica, <3 nm for phosphate doped glasses etc.); and characterized in that, all the optical components have to be selected for low absorption in the blue region of the spectrum and the fabrication of the fiber coupler has to be optimized for blue light transmission; and, wherein one or more of the optical components are selected for low absorption in the blue region of the spectrum and the fabrication of the fiber coupler has to be optimized for blue light transmission.

Embodiments of these laser systems, modules, submodules preforming laser operations. Embodiments of these laser systems, modules, submodules preforming laser operations wherein the laser operation is selected from the group of operations including 3-D printing, additive manufacturing, subtractive/additive manufacturing, welding, surface treating, and cutting.

The following examples are provided to illustrate various embodiments of the present laser systems and components of the present inventions. These examples are for illustrative purposes, may be prophetic, and should not be viewed as limiting, and do not otherwise limit the scope of the present inventions.

Example 1

Figure 2:
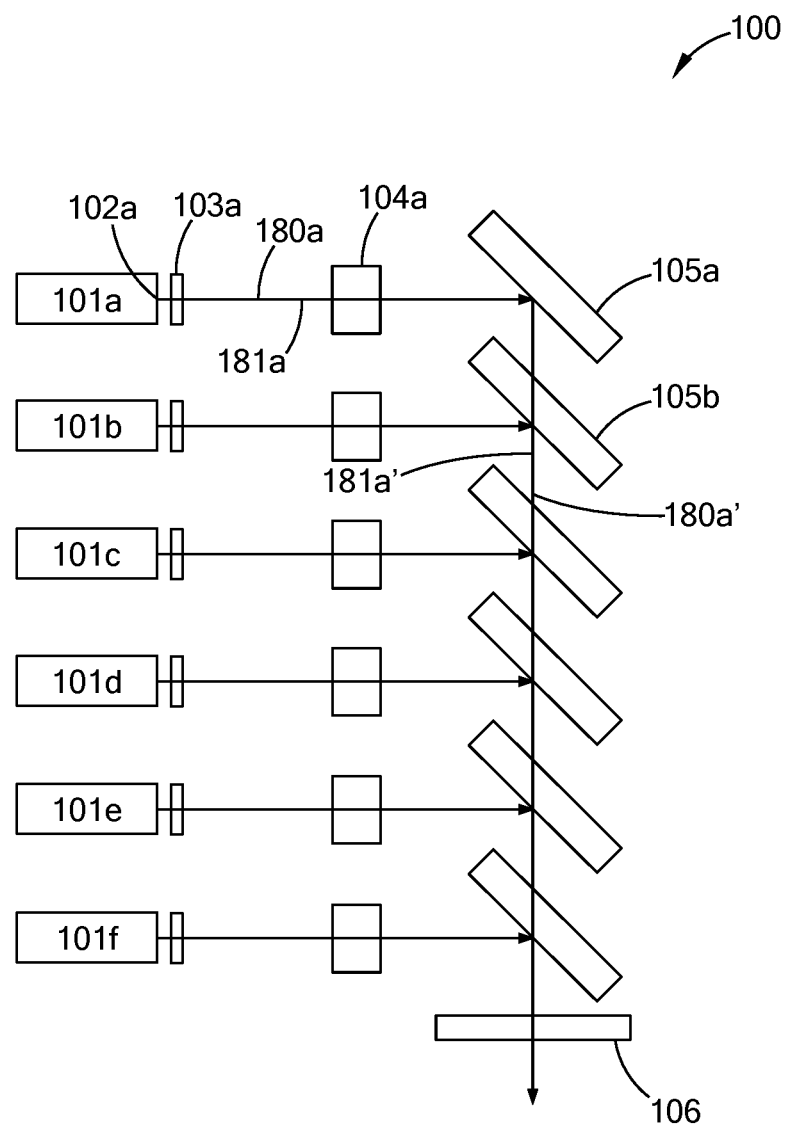
FIG. 2 is a schematic of an embodiment of a submodule of Lensed Chip on Submount (LCOS) with an integral VBG for establishing a specific wavelength in accordance with the present inventions.

An embodiment of an assembly (e.g., a submodule) 100 is a configuration of six Lensed Chip on Submount (LCOS), and is illustrated schematically in FIG. 2. In the submodule 100 each LCOS has a gain element 101a, 101b, 101c, 101d, 101e and 101f, that each generate laser beams, e.g., 180a, traveling along laser beam paths, e.g., 181a (the laser beam is on, or coincident with the laser beam path, and thus, illustrated as a single arrow). The ability to lock the gain elements 101a to 101f, to a single element is enhanced by the lower reflectivity (LR) facet coating, e.g., 102a, which is preferably on each of the GaN gain elements 101a to 101f. Each of the gain elements 101a to 101f, has a fast axis collimating lens, e.g., 103a and a slow axis collimating lens, e.g., 104a. Each gain element 101a to 101f has a turning mirror, e.g., 105a. In this manner the laser beams and the laser beam paths each extend from the gain element, e.g., 101a, through the fast axis collimator (FAC), e.g., 103a, then the slow axis collimator (SAC), e.g., 104a, then to the turning mirror, e.g., 105a. The first turning mirror 105a, turns, (e.g., redirects) the laser beam path and laser beam to a second turning mirror, 105b, and then subsequent turning mirrors. The redirected laser beam 180a' and laser beam path 181a' are combined by the subsequent turning mirrors, e.g., 105b, with the laser beams and laser beam paths from the other gain elements 101b, 101c, 101d, 101e, 101f. The redirected and combined laser beam and laser beam path then exits through a VBG 106.

The VBG 106 is at the exit of submodule 100 and is for locking all of the gain elements on the submodule 100 to a single wavelength. The VBG may be integrated into the FAC or the SAC. Similarly, the locking element, a diffractive grating may be the turning mirror shown in this figure which eliminates the need for the VBGs.

The LOCS can be assembled on a base, e.g., a sub-mount (not shown in FIG. 1), that can also function as a heat sink.

It being understood, that 2, 3, 4, 5, 7 8, 9, 10, tens, and hundreds of gain elements can be used of a single submodule or assembly. It further being understood that although the optical components along the beam paths as shown in FIG. 2 embodiment are preferable, in embodiments, some laser beam paths from a gain element may not have all of the optical components along the beam path as shown in the embodiment of FIG. 2.

The embodiment of FIG. 2 can provided, for example, the laser beam achieved from locking a single GaN gain element to a specific wavelength as shown in FIGS. 1 and 1A, where the external cavity laser is operating with a linewidth of 0.045 nm. This linewidth is, well below an embodiment of a requirement for a dense wavelength beam combination method described in this specification.

Example 1A

In an embodiment of the submodule of FIG. 2 also includes a Zener diode for back bias protection, which would be located along one or more and all of the beam paths.

Example 1B

In an embodiment of the submodule of FIG. 2, the Slow Axis Collimating (SAC) lens 104 is separate from the turning mirror 105. In an embodiment the two may be combined using an off-axis parabola approach or the SAC lens may be mounted after the turning mirror depending on the design goals for the submodule.

Example 2

Figure 3:
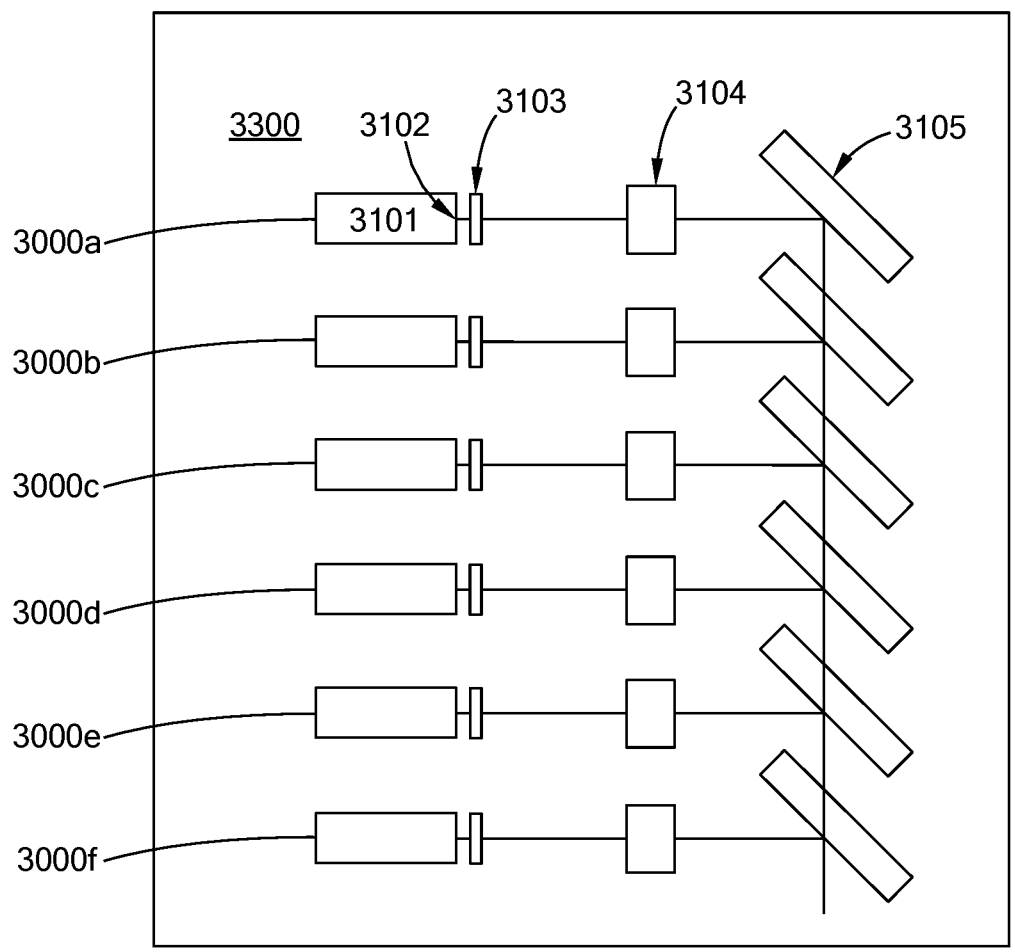
FIG. 3 is a schematic of an embodiment of a submodule of six LCOS, without an integral VBG, in accordance with the present inventions.

Turning to FIG. 3 there is shown a schematic of an embodiment of an assembly that allows the gain elements to be locked by the combination of the individual dichroic mirrors and a common output coupler. In this embodiment the assembly, e.g., a submodule, includes six LCOS, 3000a, 3000b, 3000c, 3000d, 3000e, 3000f, integrated into the submodule and being mounted on a base 3300, (e.g., a baseplate, heatsink, mounting block). Each of the six LCOS has a gain element, e.g., 3101, having a lower reflectivity (LR) facet coating, e.g., 3102, an FAC, e.g., 3103, an SAC, e.g., 3104, and a turning and beam combining element, e.g., 3105.

Example 3

Figure 4:
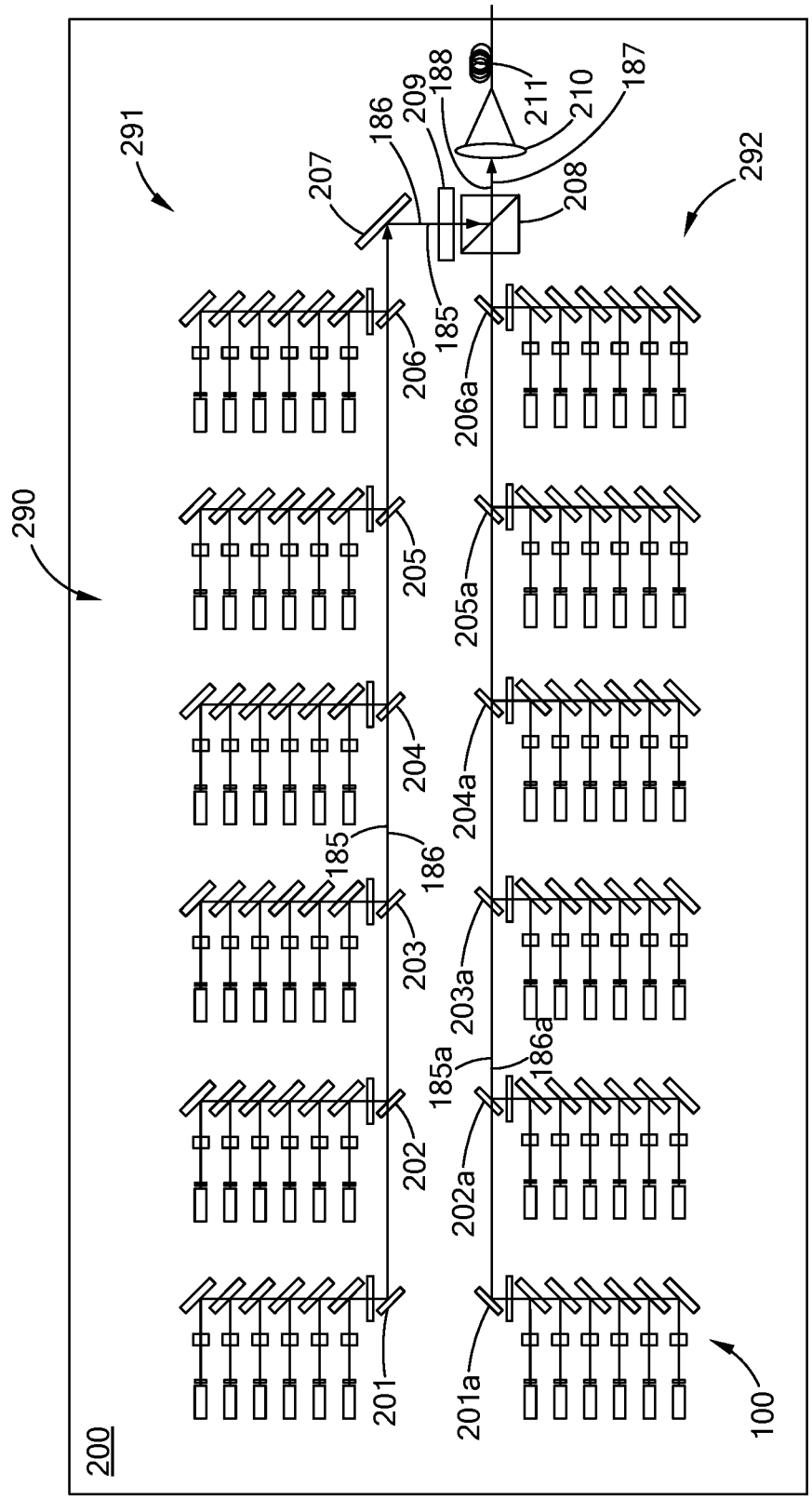
FIG. 4 is a schematic of a laser module having two rows of six submodules of the type shown in FIG. 2, in accordance with the present inventions.

Turning to FIG. 4, there is shown a schematic of a laser module 290 on a base 200. The laser module 290 has two rows 291, 292, of LCOS submodules. In this embodiment each row 291, 292, has six LCOS submodules. In this embodiment all twelve of the LCOS submodules are the submodules 100 of the embodiment of FIG. 2. It being understood that more or less rows, more or less submodules, and submodules of the same or different types may be used.

The submodules are optically combined with a series of combining optical elements, e.g., dichroic filters, VBGs or Diffractive gratings. Thus, in this embodiment each of the submodules, e.g., 100, in row 292, direct their laser beam paths and lasers into dichroic filters, 201a, 202a, 203a, 204a, 205a, 206a, which form a combined laser beam 185a, along laser beam path 186a. Each of the submodules in row 291, direct their laser beam paths and lasers into dichroic filters, 201, 202, 203, 204, 205, 206, which form a combined laser beam 185, along laser beam path 186. (It is noted that in the drawings as the laser beam travels along the laser beam path, only a single line is shown for both the laser beam and its path.)

Figure 7:
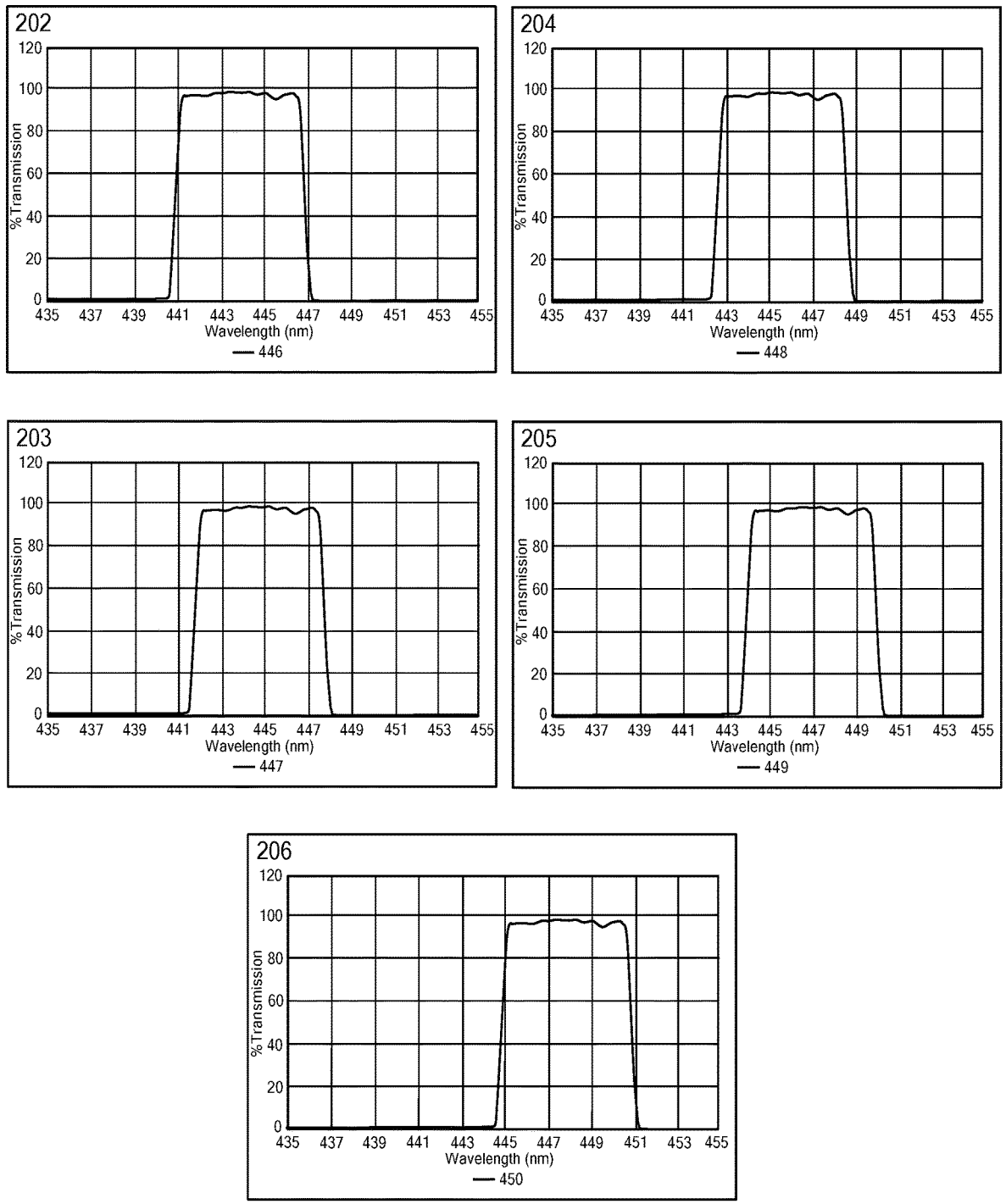
FIGS. 7 and 7A are spectra (x-axis is wavelength in nanometers (nm) and y-axis is % transmission) of the bandpass function of the respective filters of FIG. 4 in accordance with the present inventions.
Figure 7A:
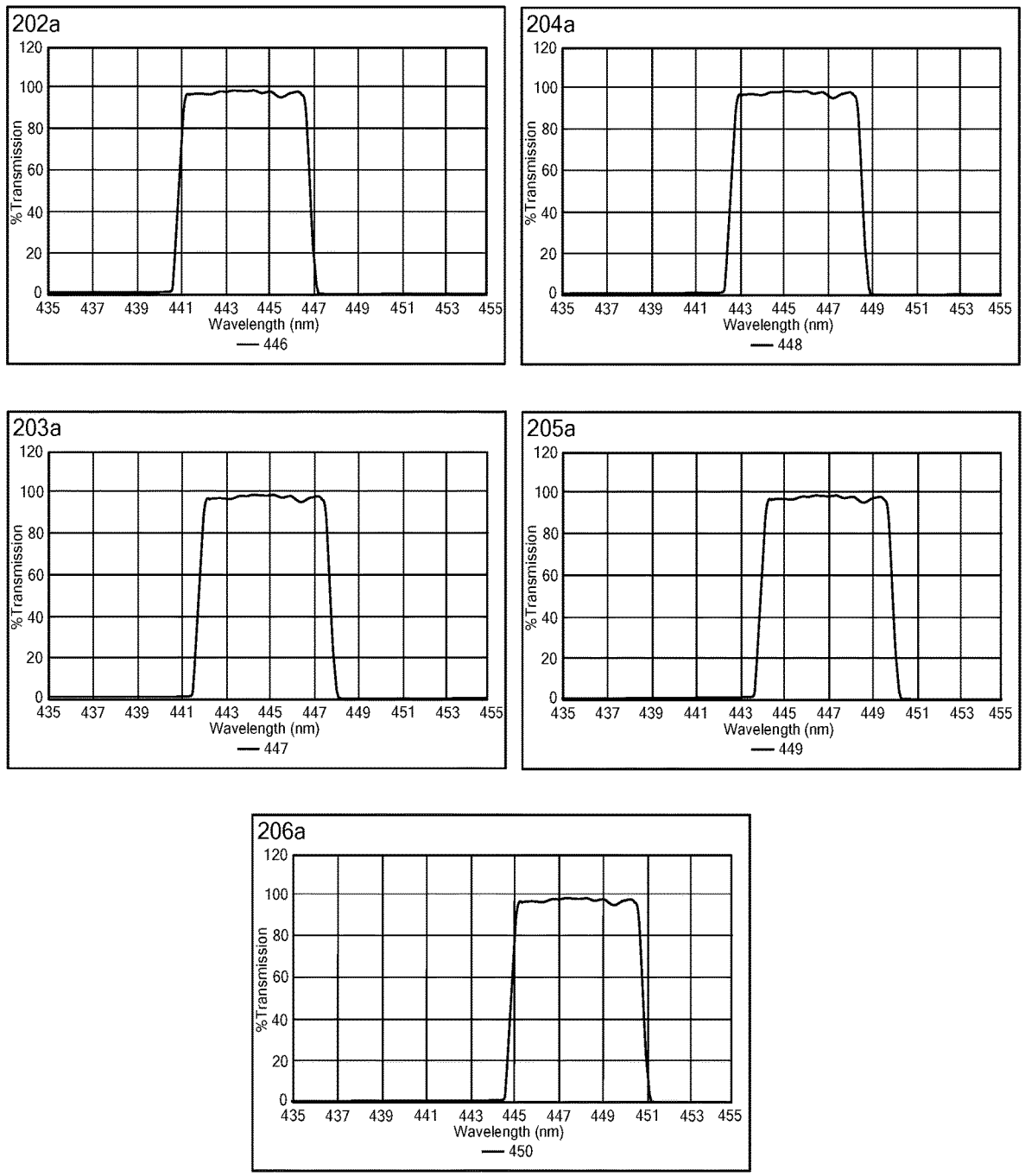

The passband functions for each of the dichroic filters are shown in FIGS. 7 and 7A (like numbers correspond to like numbers of the filters). Thus, filters 202, 202*a* are for a nominal 446 nm wavelength beam, having a lower cut off of at 440.5 nm and upper cut off at 447.25 nm. Filters 203, 203*a* are for a nominal 447 nm wavelength beam, having a lower cut off at 441.5 nm and upper cut off at 448.25 nm. Filters 204, 204*a* are for a nominal 448 nm wavelength beam, having a lower cut off at 442.5 nm and upper cut off at 449.25 nm. Filters 205, 205*a* are for a nominal 449 nm wavelength beam, having a lower cut off at 443.5 nm and upper cut off at 450.25 nm. Filters 206, 206*a* are for a nominal 450 nm wavelength beam, having a lower cut off at 444.5 nm and upper cut off at 451.25 nm. (Lower and upper cut offs refer to the point in the spectra where the transmission changes from, or to, zero.)

Thus, each of the passbands are overlapped such that a transmission window is created at the red edge of each bandpass filter. By reversing the order of the dichroic filters (206, 206*a* to 201, 201*a*) the passbands can be shifted to the blue edge of each bandpass filter. The bandpass filter functions were calculated using a thin film coating model and optimized for edge steepness and transmission. The transmission windows can be staggered by as little as about 0.75 nm, greater amounts of staggering, e.g., 0.8 nm-3 nm, 0.8 nm-1.8 nm, about 0.8 nm, about 1.0 nm, about 1.5 nm, may also be used. In the embodiment shown in FIG. 7, the transmission windows are staggered by 1 nm. The filters used in this embodiment can be bandpass, low pass or high pass, some bandpass filters can provide a steeper edge transition and therefore a denser wavelength combination than any other laser currently on the market. After the submodules are all aligned co-linear, then the output from row 292 and row 291, are overlapped in polarization with each other. Thus, the output laser beam 185*a* from row 292 and the output laser beam 185 from row 291 are combined in an overlapping polarized relationship. This relationship is accomplished with the turning mirror 207, which receives beam 185 and beam path 186, and directs the beam 185 and beam path 186 toward the polarization rotating element 209; and, the polarization beam splitter 208, which receives laser beam 185*a* and beam path 186*a*, and combines those with beam 185 and path 186, to provide a further combined laser beam 187 along beam path 188. The combined beam 187 is launched into optical fiber 211 by optical element 210, e.g., a lens., This lens is designed to focus all of the submodules to a single point over the bandwidth (~10 nm) of the combined beams. This type of lens can be, for example, an asphere, a simple doublet or a Cooke Triplet, depending on the speed of the optical component. Due to the high laser power being conveyed through these elements, e.g., 209, 208, 210, 211, they may be optically contacted, air-spaced, or both, to minimize heating and distortion of the output beam.

Example 4

Figure 10:
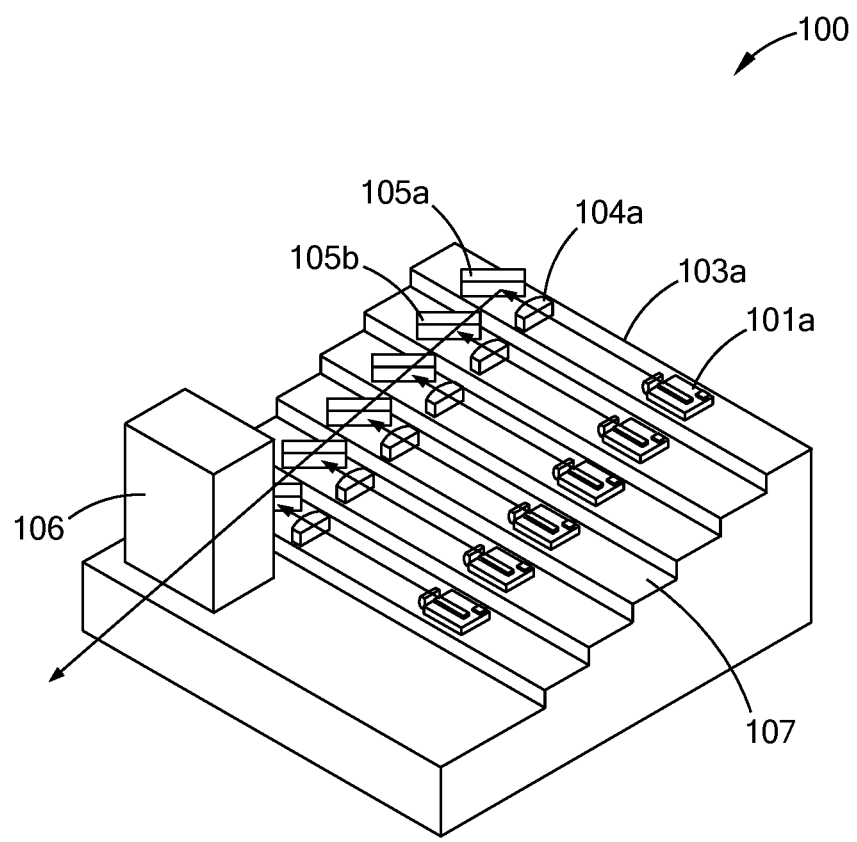
FIG. 10 is a perspective view of a submodule of the type shown in FIG. 2 on a stair step base plate, in accordance with the present inventions.

Turning to FIG. 10, a LCOS submodule 100, of the type shown in FIG. 2, (like numbers have the same meaning) is assembled on a stair stepped sub-mount 107, that also functions as a heat sink. (Although the beam paths and laser beams are shown in FIG. 10, they have not been labeled for simplicity, but are the same the beam paths in FIG. 2). The submodule 100, has six LCOS assemblies or elements. Each LCOS has a gain element, e.g., 101*a*, an FAC, e.g., 103*a*, an SAC, e.g., 104*a*, and a turning mirror, e.g., 105*a*. The first turning mirror 105*a*, turns, (e.g., redirects) the laser beam path and laser beam to a second turning mirror, 105*b*, and then subsequent turning mirrors. The redirected laser beam and laser beam path are combined by the subsequent turning mirrors, e.g., 105*b*, with the laser beams and laser beam paths from the other gain elements. The redirected and combined laser beam and laser beam path then exits through a VBG 106.

The six LCOS elements are mounted on a base 107, which can be a heatsink, such as for example a plated Cu heatsink. The optical beams are collimated in the slow axis using slow axis collimating (SAC) lenses. The beams are reflected by turning mirrors and they are directed on a volume Bragg grating (VBG) 106. The VBG is the outcoupling mirror of the external cavity formed between the semiconductor gain elements and the VBG. The number of diodes determines the numerical aperture and the spot size for the module, or the module brightness, this example is optimized to provide about a 5 mm-mrad beam parameter product.

Example 5

In an embodiment, the SBC module of FIG. 4, includes "N" submodules or equivalent elements mounted on both sides of the base 200. The base of the package can be made of a thermally conductive material like Cu or equivalent and it is mounted on a fluid cooled heatsink of the macro-channel or micro-channel type.

Example 6

Figure 8:
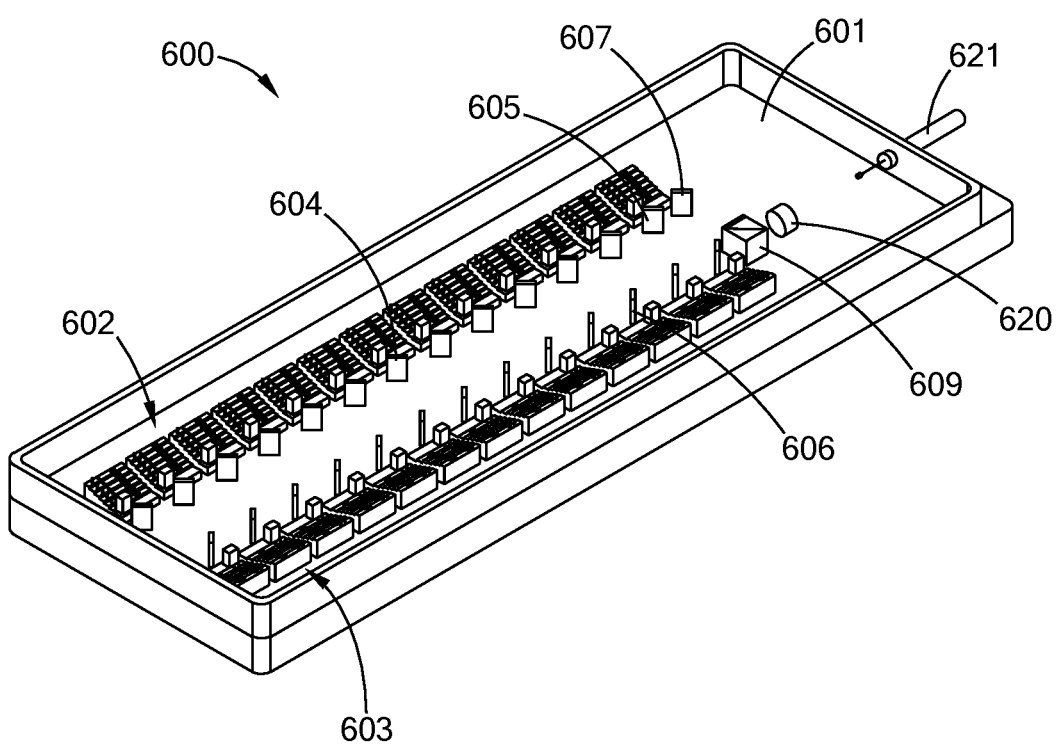
FIG. 8 is perspective view of an embodiment of a Spectral Beam Combining (SBC) assembly in accordance with the present inventions.

Turning to FIG. 8 there is shown a perspective view of an embodiment of an Spectral Beam Combining (SBC) module 600 that includes 26 submodules, of the type shown in FIG. 10, mounted in a base 601, in two rows 602, 603 of 13 each. Each module in each row has a series of dichroic mirrors, e.g., 604, 605, 606. These mirrors are located in front of each submodule with a wavelength distribution, e.g., generally along the lines of FIGS. 7 and 7A. Thus, there are 26 dichroic mirrors, one associated with each submodule. The dichroic mirror reflects the narrow spectral emission from a submodule (typically 0.75 nm wide) and allows transmission of the other wavelengths. The wavelengths are multiplexed, with the sum of all emission wavelengths of the order of 10 nm wide. A turning mirror 607 reflects the multiplexed beams from the 13 submodules in row 602 towards a polarization beam combing optical element 609.

The laser beams from the two rows are combined using polarization combining optics 609, which consist of a polarization rotating half-wave plate and a polarization beam combining beam-splitter. The broad band half waveplate and the polarization beam combining cube are optically contacted to make a compact beam combiner assembly. The combined beam is then shaped by fiber coupling optics 620 and is finally coupled into an optical fiber 621.

Example 7

Figure 5:
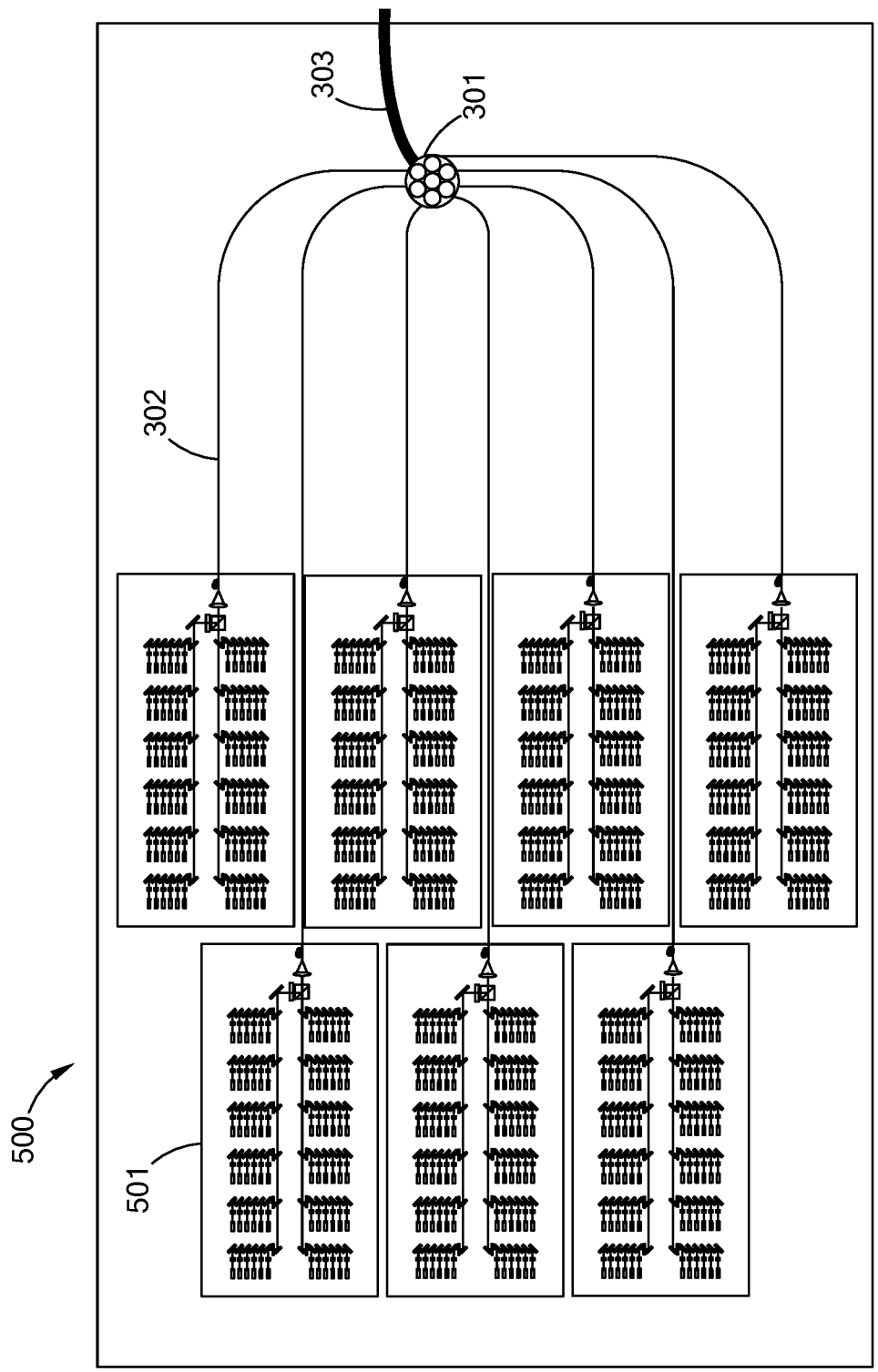
FIG. 5 is a schematic of a complete kW-class laser system having seven of the modules of the type shown in FIG. 4, in accordance with the present inventions.

Turning to FIG. 5, there is shown a schematic of an embodiment of a complete kW-class laser system 500, having seven SBS modules of the type shown in FIG. 4. Each SBC module, e.g., 501, is the type shown in FIG. 4 and is fiber-coupled. In this manner a fiber combiner 301 is used to combine the seven fibers, e.g., 302, into a single delivery fiber 303. Here the SBC module fiber 302 has a diameter of 50 μm, while the delivery fiber 303 has a diameter of for example about 150 μm. Larger and smaller diameters for the deliver fiber are contemplated from around for example 75 μm to about 400 μm, and larger, depending on factors such as the number and size of module fibers, and the number of gain elements in each submodule.

In an embodiment of this laser system that is optically combined through a fiber combiner; this combiner is based, for example, on the close hexagonal packing principle for optical fibers.

Figure 5A:
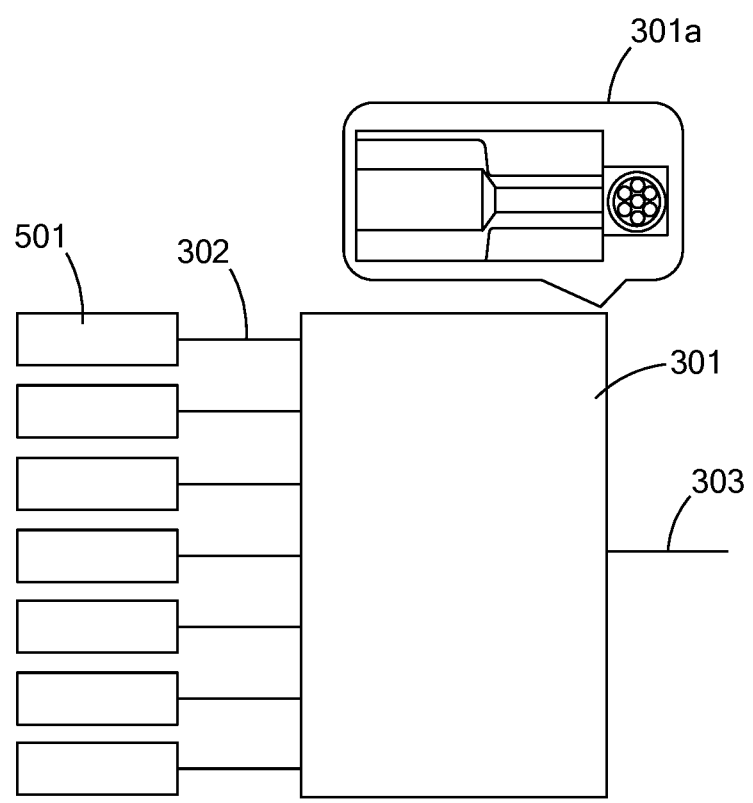
FIG. 5A is a block schematic of the embodiment of FIG. 5.

FIG. 5A is a block schematic cross section of the configuration of FIG. 5, (like numbers corresponding to like components), with a detailed schematic of the fiber combiner 301a.

Example 8

Figure 6:
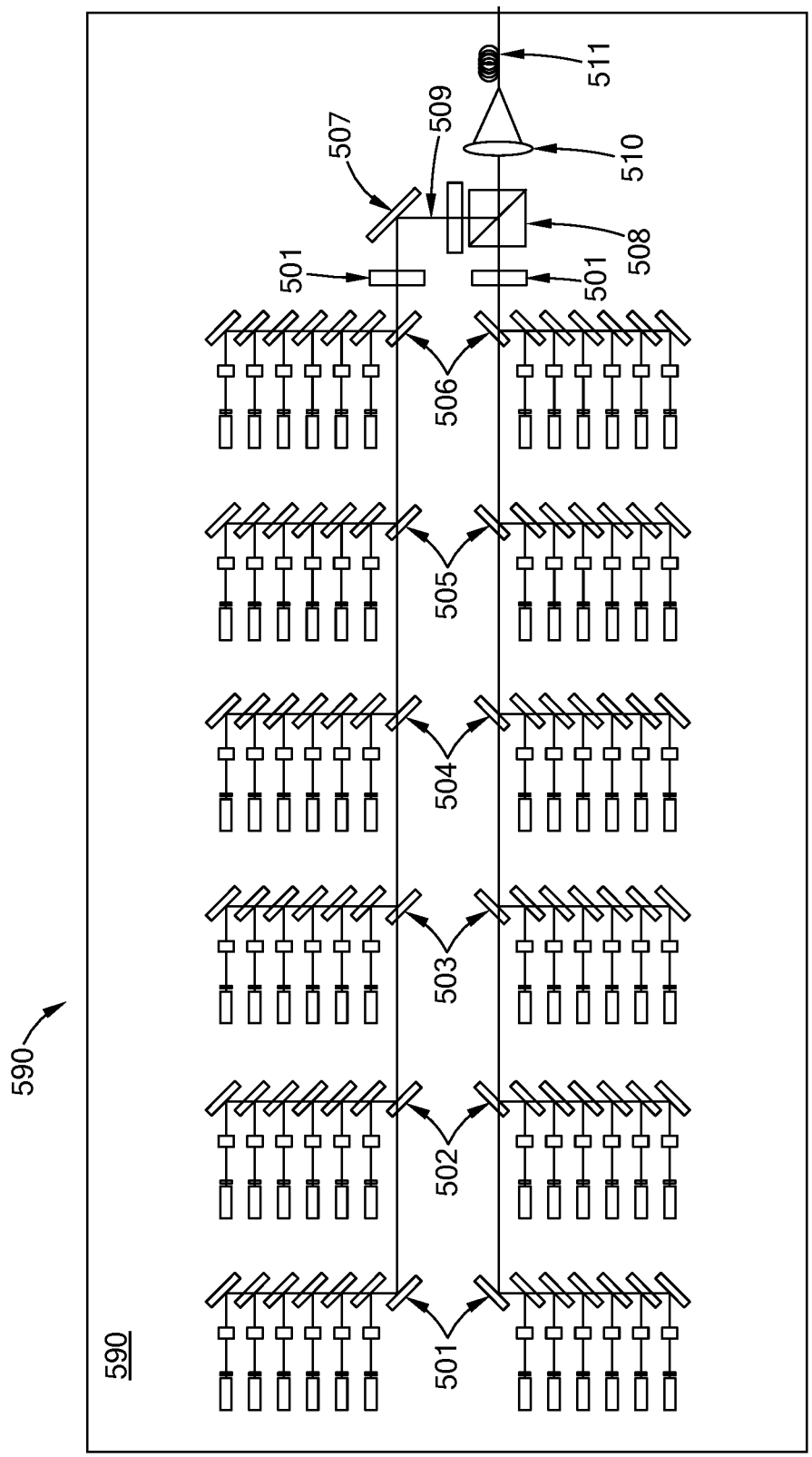
FIG. 6 is a schematic of a dense wavelength beam combination system without a VBG having two rows of the submodule of the type shown in FIG. 3, in accordance with the present inventions.

Turning to FIG. 6 there is shown a schematic of an embodiment of a method to building a dense wavelength beam combination system without having to use a VBG. Turning to FIG. 6, there is shown a schematic of a laser module 500 on a base 590. The laser module 500 has two rows of LCOS submodules. In this embodiment each row has six LCOS submodules. In this embodiment all twelve of the LCOS submodules are the submodules of the embodiment shown in FIG. 3. It being understood that more or less rows, more or less submodules, and submodules of the same or different types may be used.

Here the individual submodules are all aligned colinear and a common output coupler 501 provides the feedback signal to each of the submodules through pairs of dichroic filters 501-506. These beams are combined with the turning mirror 507, which receives the laser beam and beam path, and directs the beam and beam path toward the polarization rotating element 509; and, the polarization beam splitter 5, which receives laser beam and beam path, and combines those with the other beam and path from 507. The combined beam is launched into optical fiber 511 by optical element 510, e.g., a lens., This lens is designed to focus all of the submodules to a single point over the bandwidth (~10 nm) of the combined beams. This type of lens can be, for example, an asphere, a simple doublet or a Cooke Triplet, depending on the speed of the optical component. Due to the high laser power being conveyed through these elements may be optically contacted, air-spaced, or both.

Figure 9:
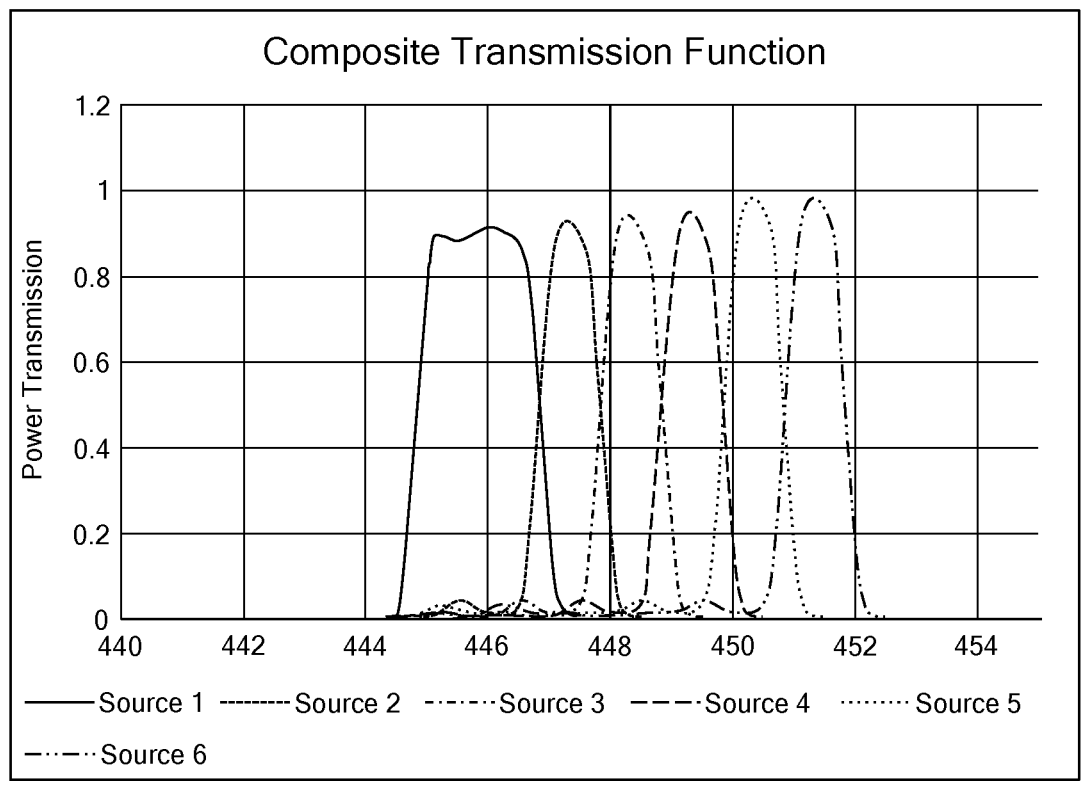
FIG. 9 is a spectra (x-axis is wavelength in nanometers (nm) and y-axis is % transmission) of the bandpass function of the filters of FIG. 6 in accordance with the present inventions.

FIG. 9 illustrates what the transmission function for a round trip would be for each of the individual sources, of the configuration of FIG. 6, thus establishing an oscillating bandwidth for each of the sources which would by definition of a laser cavity result in a composite beam with all beams colinear and full power. These beams can then be combined in the same fashion as the previous example using a polarization beam rotator followed by a polarization beam combining cube or pellicle.

Example 9

Figure 11:
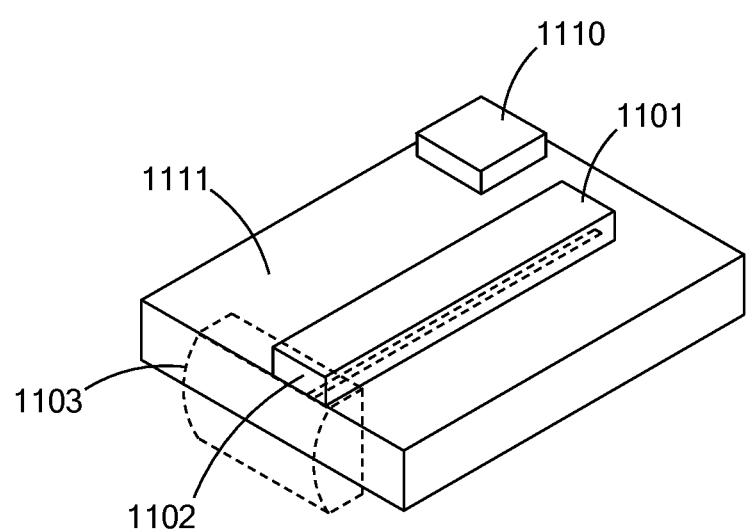
FIG. 11 is a perspective view of a LCOS in accordance with the present inventions.

The LCOS shown in FIG. 11 includes the gain element 1101 with a lower reflectivity coating 1102, a Zener diode for back bias protection 1110, a fast axis collimating lens 1103 and a submount 1111.

It is noted that there is no requirement to provide or address the theory underlying the novel and groundbreaking processes, materials, performance or other beneficial features and properties that are the subject of, or associated with, embodiments of the present inventions. Nevertheless, various theories are provided in this specification to further advance the art in this area. The theories put forth in this specification, and unless expressly stated otherwise, in no way limit, restrict or narrow the scope of protection to be afforded the claimed inventions. These theories many not be required or practiced utilizing the present inventions. It is further understood that the present inventions may lead to new, and heretofore unknown theories to explain the function-features of embodiments of the methods, articles, materials, devices and system of the present inventions; and such later developed theories shall not limit the scope of protection afforded the present inventions.

The various embodiments of systems, equipment, techniques, methods, activities and operations set forth in this specification may be used for various other activities and in other fields in addition to those set forth herein. Additionally, these embodiments, for example, may be used with: other equipment or activities that may be developed in the future; and with existing equipment or activities which may be modified, in-part, based on the teachings of this specification. Further, the various embodiments set forth in this specification may be used with each other in different and various combinations. Thus, for example, the configurations provided in the various embodiments of this specification may be used with each other; and the scope of protection afforded the present inventions should not be limited to a particular embodiment, configuration or arrangement that is set forth in a particular embodiment, example, or in an embodiment in a particular Figure.

The invention may be embodied in other forms than those specifically disclosed herein without departing from its spirit or essential characteristics. The described embodiments are to be considered in all respects only as illustrative and not restrictive.

The invention claimed is:

1. An optical apparatus configured to produce a multi-kW laser radiation with blue emission in a range of 400 nm to 495 nm, the optical apparatus comprising:
   a. a plurality of fiber-coupled modules, where each of the plurality of modules comprises a plurality of submodules;
      i. wherein the submodules comprise a lensed blue semiconductor gain chip from a GaN material system, with a coating on a front facet with lower reflectivity optimized for locking;
      ii. wherein the gain chip is mounted on thermally conductive sub-mount, with the lower reflectivity facet facing outward and with a fast axis-collimating lens attached in front of the gain chip;
      iii. wherein the gain chip is mounted on a staircase heatsink in a cavity to optimally align a fast axis beamlet;
      iv. wherein the gain chip has its slow axis collimated by a slow axis collimating lens and has its radiation being redirected by a turning mirror to an output coupler; and,
      v. wherein each of the submodules is aligned through a dichroic filter and the output coupler provides feedback to the gain chip and the dichroic filter determines an operating wavelength of each of the submodules;
   b. wherein the plurality of submodules in the plurality of fiber-coupled modules is configured, whereby;
      i. two groups of two submodules are combined through wavelength multiplexing with a bandwidth of <10 nm to define two wavelength multiplexed submodule groups; and,
      ii. the two wavelength multiplexed submodule groups are combined via polarization beam combining into an output fiber;

c. the output fibers of the plurality of fiber-coupled modules are bundled and combined into a single output fiber, thereby defining a KW-level blue laser system.

2. The optical apparatus according to claim 1, wherein each of the plurality of gain chips has a beam parameter product of <3.5 mm*mrad on the fast axis.

3. The optical apparatus according to claim 1, wherein each of the plurality of gain chips has a beam parameter product <5 mm*mrad on the slow axis.

4. The optical apparatus according to claim 1, wherein a laser beam from the single output fiber has a beam parameter product in the range of 3.5 mm-mrad to 5 mm-mrad overall.

5. The optical apparatus according to claim 1, wherein a laser beam from the single output fiber has a beam parameter product in the range of 5 mm-mrad to 10 mm-mrad overall.

6. The optical apparatus according to claim 1, wherein a laser beam from the single output fiber has a spectral emission of <10 nm.

7. The optical apparatus according to claim 1, wherein a laser beam from the single output fiber has a spectral emission in the range of 1 nm to 20 nm.

8. The optical apparatus according to claim 1, wherein each of the gain chip front facets reflectivity is <10%.

9. The optical apparatus according to claim 1, wherein each of the gain chip front facets reflectivity is in the range of 10% to 30%.

10. The optical apparatus according to claim 1, wherein at least one of the submodules comprises a plurality of gain chips.

11. The optical apparatus according to claim 10, wherein the gain chips are connected electrically and wire-bonded to submodule electrodes.

12. The optical apparatus according to claim 1, wherein, each submodule has <1 nm spectral distribution following wavelength locking in the cavity.

13. The optical apparatus according to claim 1, wherein at least one of the fiber-coupled modules comprises two sets of twelve submodules.

14. The optical apparatus according to claim 1, comprising a cooling manifold.

15. The optical apparatus according to claim 1, comprising safety interlocks.

16. The optical apparatus according to claim 1, comprising optical power-monitoring detectors.

17. The optical apparatus according to claim 1, comprising temperature-monitoring sensors.

18. An optical apparatus configured to produce a multi-kW laser radiation with blue emission in a range of 400 nm to 495 nm, the optical apparatus comprising:
a. a plurality of fiber-coupled modules, where each of the plurality of fiber-coupled modules comprises a plurality of submodules;
   i. wherein the submodules comprise a plurality of lensed blue semiconductor laser chips from a GaN material system, with a Distributed Bragg or Feedback Grating integrated into the laser chip to select an operating wavelength;
   ii. wherein the laser chips are mounted on thermally conductive sub-mounts, with a lower reflectivity facet facing outward and with a fast axis-collimating lens attached in front of the laser chips;
   iii. wherein the laser chips are mounted on a thermally conductive heatsink, with a slow axis collimating lens positioned after the fast axis-collimating lens, thereby defining lensed laser chips;
   iv. wherein the lensed laser chips are mounted on a staircase heatsink;
   v. wherein a polarization of each laser chip is established by a waveguide configuration;
b. wherein the plurality of submodules in the plurality of fiber-coupled modules is configured whereby;
   i. the submodules are combined through wavelength multiplexing with a bandwidth of <10 nm to define a plurality of wavelength multiplexed submodule groups; and,
   ii. the wavelength multiplexed submodule groups are combined via polarization beam combining into an output fiber;
c. the output fibers of the plurality of fiber-coupled modules are bundled and combined in a fiber coupler into a single output fiber, thereby defining a KW-level blue laser system.

19. The apparatus of claim 18, wherein an output of the laser chips is collimated and is redirected with a turning mirror to a beam combining element.

20. The apparatus of claim 18, wherein an output of the laser chips is collimated and is aligned with a beam combining element.

21. The apparatus of claim 18, comprising a reactive multi-layer foil, wherein the foil undergoes a self-sustaining exothermic reaction after a heat pulse to bond the lensed laser chips into the submodules and the submodules into the modules.

22. The apparatus of claim 18, configured to provide a sufficiently narrow linewidth to pump a fiber based Raman laser.

23. The apparatus of claim 18, wherein all optical components have low absorption in the blue region of the spectrum and the fiber coupler is optimized for blue light transmission.

24. A method of using the apparatus of claim 1 for a laser operation.

25. The method of claim 24, wherein the laser operation is selected from one or more of 3-D printing, additive manufacturing, subtractive/additive manufacturing, welding, surface treating, and cutting.

26. A method of using the apparatus of claim 18 for a laser operation.

27. The method of claim 26, wherein the laser operation is selected from one or more of 3-D printing, additive manufacturing, subtractive/additive manufacturing, welding, surface treating, and cutting.

\* \* \* \* \*